United States Patent
Durante et al.

(10) Patent No.: US 12,143,075 B2
(45) Date of Patent: Nov. 12, 2024

(54) CIRCUIT FOR DOWNLINK/UPLINK OPERATIONAL MODE SWITCHING IN A TDD WIRELESS COMMUNICATION SYSTEM

(71) Applicant: TEKO TELECOM S.r.l., Castel San Pietro Terme (IT)

(72) Inventors: Davide Durante, Castel San Pietro Terme (IT); Massimo Notargiacomo, Castel San Pietro Terme (IT)

(73) Assignee: TEKO TELECOM S.r.l., Castel San Pietro Terme (IT)

( * ) Notice: Subject to any disclaimer, the term of this patent is extended or adjusted under 35 U.S.C. 154(b) by 507 days.

(21) Appl. No.: 17/620,859

(22) PCT Filed: Jul. 9, 2020

(86) PCT No.: PCT/IB2020/056472
§ 371 (c)(1),
(2) Date: Dec. 20, 2021

(87) PCT Pub. No.: WO2021/005555
PCT Pub. Date: Jan. 14, 2021

(65) Prior Publication Data
US 2022/0345094 A1    Oct. 27, 2022

(30) Foreign Application Priority Data

Jul. 11, 2019  (IT) .................. 102019000011475

(51) Int. Cl.
H03F 3/19       (2006.01)
H03F 1/30       (2006.01)
(Continued)

(52) U.S. Cl.
CPC ............ *H03F 3/193* (2013.01); *H03F 1/301* (2013.01); *H03F 3/245* (2013.01); *H03F 3/72* (2013.01);
(Continued)

(58) Field of Classification Search
CPC . H03F 3/193; H03F 3/245; H03F 3/72; H03F 1/301; H03F 2200/29; H03F 2200/45; H04B 1/48
See application file for complete search history.

(56) References Cited

U.S. PATENT DOCUMENTS 6,175,747 B1 *  1/2001  Tanishima ......... H04Q 11/0442
                                                         455/562.1
8,498,602 B2 *  7/2013  Xu ...................... H03D 7/1483
                                                         455/307

(Continued)

FOREIGN PATENT DOCUMENTS

CN      109 450 386 A      3/2019
WO   WO 2019/000426 A1     1/2019

*Primary Examiner* — Patricia T Nguyen
(74) *Attorney, Agent, or Firm* — ASLAN LAW, P.C.

(57) ABSTRACT

A circuit for downlink/uplink operational mode switching in a TDD wireless communication system comprises a field-effect transistor operatively connected to a power amplifier on the downlink path of a RF front-end apparatus in a TDD wireless communication system, a first voltage generator connected to a large-value first resistor, a second voltage generator connected to a second resistor, a large-value hold capacitor, and a sample-and-hold circuit configured to be switched between a reception configuration, wherein the first voltage generator is connected to the gate of the field-effect transistor and the large-value capacitor is connected to the first voltage generator through the first resistor, and a transmission configuration, wherein the gate of the field-effect transistor is connected to the hold capacitor and
(Continued)

the hold capacitor is connected to the second voltage generator through the second resistor.

11 Claims, 3 Drawing Sheets

(51) Int. Cl.
*H03F 3/193* (2006.01)
*H03F 3/24* (2006.01)
*H03F 3/72* (2006.01)
*H04B 1/48* (2006.01)

(52) U.S. Cl.
CPC ......... *H04B 1/48* (2013.01); *H03F 2200/294* (2013.01); *H03F 2200/451* (2013.01); *H03F 2203/7206* (2013.01)

(56) References Cited

U.S. PATENT DOCUMENTS

| | | | |
|---|---|---|---|
| 2002/0119797 A1* | 8/2002 | Woodhead | H04B 17/318 455/3.01 |
| 2009/0252206 A1* | 10/2009 | Rheinfelder | H04B 1/18 375/298 |
| 2011/0221519 A1* | 9/2011 | Katoh | H04B 1/0057 327/558 |
| 2013/0114471 A1 | 5/2013 | Lee | |
| 2018/0262163 A1* | 9/2018 | Tokuda | G05F 3/26 |

\* cited by examiner

Fig.1
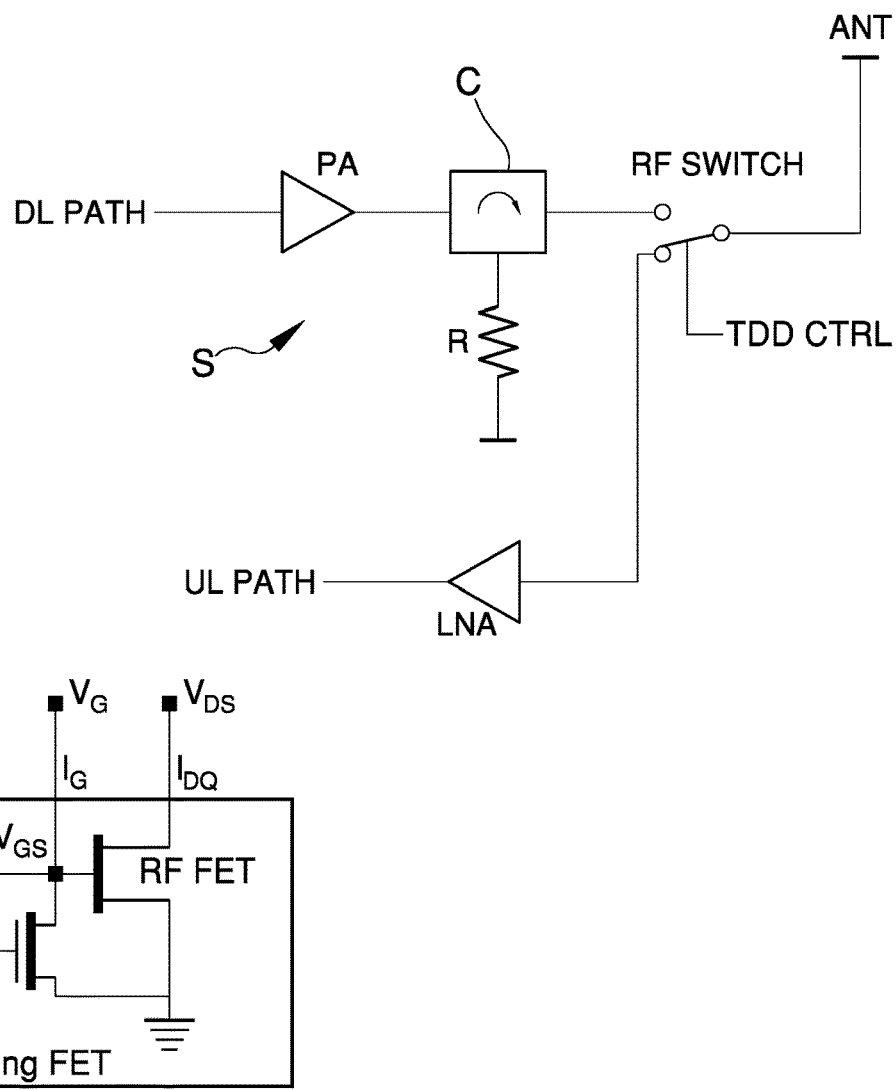
Fig.2
Fig.3
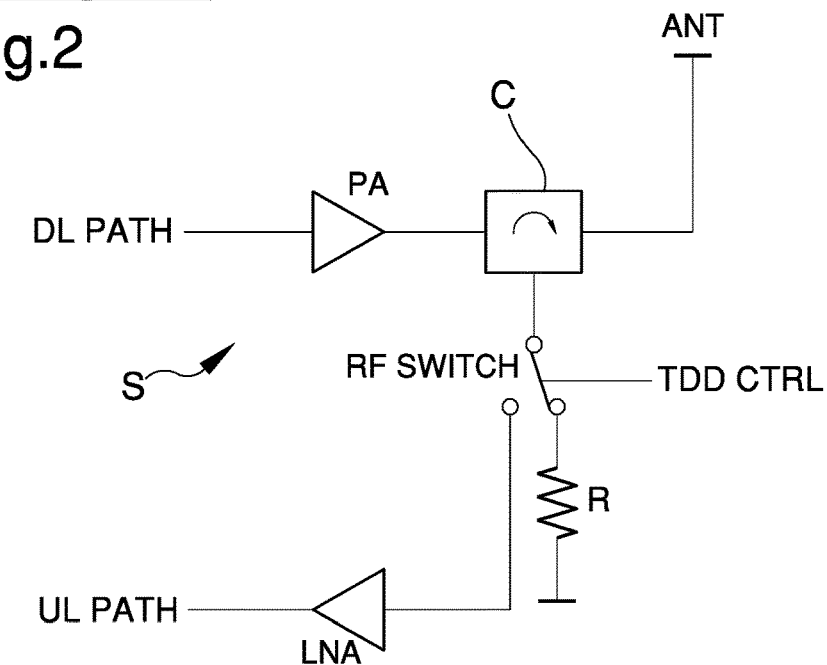

CIRCUIT FOR DOWNLINK/UPLINK OPERATIONAL MODE SWITCHING IN A TDD WIRELESS COMMUNICATION SYSTEM

CROSS-REFERENCE TO RELATED APPLICATIONS

This application claims priority to IT patent application Ser. No. 10/201,9000011475 filed on Jul. 11, 2019, and this application claims priority to and is a 371 of international PCT Application No. PCT/IB2020/056472 filed on Jul. 9, 2020, the entire contents of which are hereby incorporated by reference.

TECHNICAL FIELD

The present invention relates to a circuit for downlink/uplink operational mode switching in a TDD wireless communication system.

BACKGROUND ART

In the field of telecommunications, it is known that an efficient and fast switching from/to DL/UL (downlink/uplink) operational mode, i.e. Tx/Rx (transmission/reception), is of outmost importance when dealing with Time Division Duplexed (TDD) signals.

Particularly, when the system is in Tx mode a PA (Power Amplifier) on the DL should be turned on and this can be realized by deploying an LDMOS transistor equipped with an embedded thermal tracking device for thermal compensation. An example of high-level standard TDD RF front end designed with and high-isolation RF switch at the antenna port is showed in FIG. 1.

Particularly, it is known that during a RF power amplifier design phase, an important aspect to be considered is performance variation over temperature. In this perspective, one of the main parameters to control is the quiescent current trying to maintain it constant over a large temperature range, which is the real challenging task in this kind of design.

Quiescent current tends to rise with working temperature, whose effect is to reduce linearity. To overcome this difficulty, transistor manufactories have embedded a quiescent current thermal tracking circuit T (a small integrated LDMOS FET located close to the active power LDMOS) in latest RF power integrated circuits.

An example of tracking thermal device T is illustrated in FIG. 2.

When a constant current source is applied to gate voltage $V_G$, the thermal tracking RF FET draws a constant gate current $I_G$; when the temperature varies, the gate-source voltage $V_{GS}$ changes to maintain constant the gate current $I_G$. As a consequence, the LDMOS power FET sees a varying gate voltage, $V_{GS}$, that also maintains its quiescent current, $I_{DQ}$, constant over temperature. However, the presence of the thermal tracking device T does not allow for complete transistor shut down within Tx/Rx switching time as defined by the 3GPP standard (approximatively 1 µs).

This implies that an RF switch located at the antenna port, driven by the TDD synchronism signal, is needed to commute between Tx and Rx mode, and it has to be designed with high isolation capabilities (see FIG. 1).

However, several drawbacks are known for the above solution.

A first drawback concerns the high cost of the components. Particularly, the high cost is due to the high-isolation requirements for the RF switch.

A further drawback concerns the loss in the DL path efficiency. Particularly, the introduction of an RF switch after the PA increases DL path insertion loss, hence decreasing overall system efficiency.

Furthermore, the know solution has a reduced system reliability. The reduced reliability is due to the fact that the RF switch deals with high power levels.

Finally, the system realized according to the know solution has high power consumption. Particularly, since the PA is never completely turned off it draws quiescent current also during Rx time slots.

DESCRIPTION OF THE INVENTION

The main aim of the present invention is to provide a circuit for an efficient and fast switching from/to DL/UL (downlink/uplink) operational mode in a TDD wireless communication system.

Particularly, when the system is in Tx mode and when dealing with Time Division Duplexed (TDD) signals, the circuit according to the invention allows to turn on/off the LDMOS transistor equipped with embedded thermal tracking device in compliancy with the stringent time requirements defined by the standard.

Another object of the present invention is to provide a circuit for downlink/uplink operational mode switching in a TDD wireless communication system that allows to reduce the overall cost of the used components.

Another object of the present invention is to provide a circuit for downlink/uplink operational mode switching in a TDD wireless communication system that allows to reduce the loss in the DL path efficiency.

Another object of the present invention is to provide a circuit for downlink/uplink operational mode switching in a TDD wireless communication system that allows to improve the system reliability.

Another object of the present invention is to provide a circuit for downlink/uplink operational mode switching in a TDD wireless communication system that allows to reduce the power consumption.

The above-mentioned objects are achieved by the present circuit for downlink/uplink operational mode switching in a TDD wireless communication system according to the features of claim 1.

BRIEF DESCRIPTION OF THE DRAWINGS

Other characteristics and advantages of the present invention will become better evident from the description of a preferred, but not exclusive embodiments of a circuit for downlink/uplink operational mode switching in a TDD wireless communication system, illustrated by way of an indicative but non-limiting example in the accompanying Figures, in which:

FIG. 1 shows a high-level standard TDD RF front end designed with a high-isolation RF switch at the antenna port, according to a known solution;

FIG. 2 illustrates a tracking thermal device according to a known solution;

FIG. 3 shows a high-level standard TDD RF front-end designed with a high-isolation RF switch at the antenna port, according to the invention;

EMBODIMENTS THE INVENTION

With particular reference to such illustrations, globally indicated with reference C is a circuit for downlink/uplink operational mode switching in a TDD wireless communication system.

The circuit C according to the invention allows to remove in a high-level TDD RF front end the RF switch at the antenna port and place it in the UL path before LNA, as shown in FIG. 3, hence addressing all issues of the known solutions.

Particularly, the circuit C is designed to act on the power amplifier LDMOS FET Gate voltage, while the Drain voltage is maintained constant.

From a high-level viewpoint, the circuit C according to the invention comprises:
  a voltage generator for setting the quiescent Drain current of the power amplifier LDMOS;
  a large-value resistor connected in series to the voltage generator;
  a sample-and-hold circuit comprising two analog switches driven by the synchronism signal of the TDD standard and a hold capacitor.

This circuit C allows for LDMOS power amplifier PA complete shut down in a very limited time interval, even if the embedded thermal tracking device needs a high resistor in series at the gate port of LDMOS for its correct functioning.

The resistor limits the current feeding the Gate port to change the LDMOS status (i.e. switching from on to off and vice versa), hence increasing the activation/deactivation time exceeding 3GPP standard's limits.

Moreover, a long commutation period potentially causes the reactive parasite effects of surrounding circuit components to be quite heavy, resulting in larger damped oscillations of the Drain current (whose module could be much larger than the maximum LDMOS current).

Focusing on a TDD scenario, RF LDMOS used to realize the power amplifier PA needs to be active only during Tx phase (DL period). One option to increase overall system efficiency, while removing possible source of thermal noise at the output of the power amplifier PA, is to turn off the RF LDMOS during RX phase (UL phase) by minimizing quiescent current, $I_{DQ}$.

The challenge is to realize it using RF FET equipped with thermal tracking devices while keeping transitions latency from TX to RX phases lower than 1 μs, as required by 3GPP standard.

Figure 4:
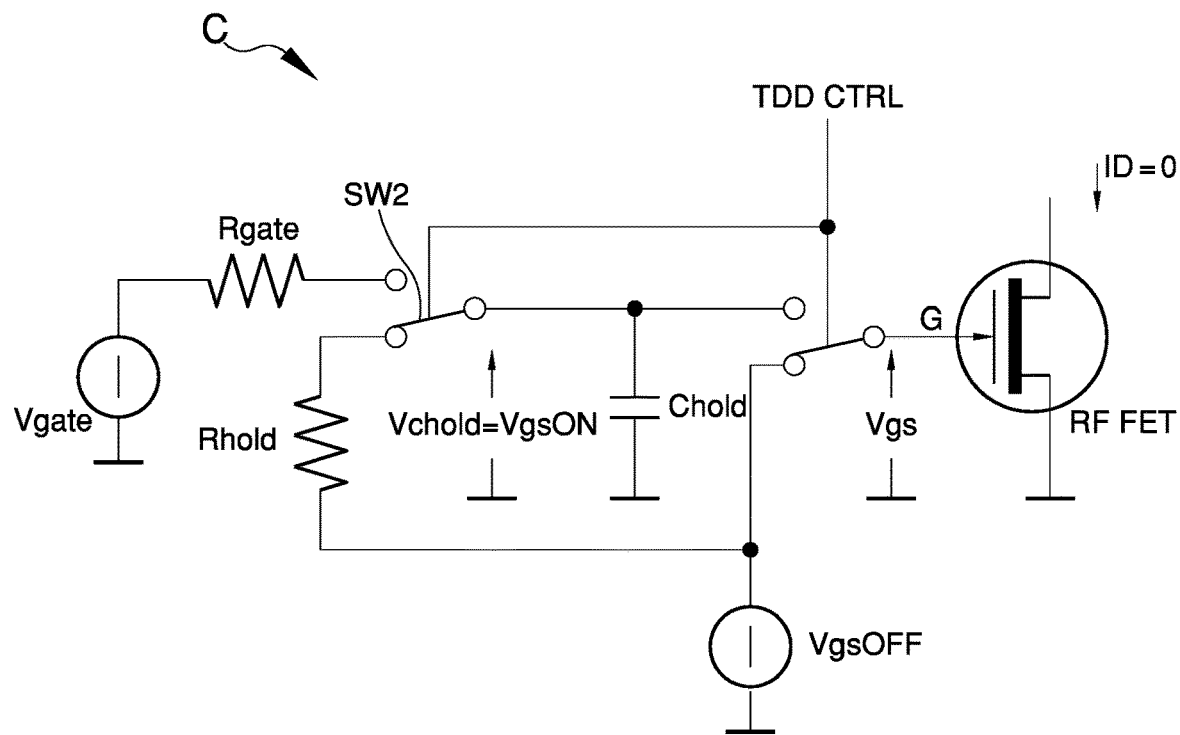
FIG. 4 is a high-level electrical scheme of the switching circuit for RF LDMOS activation/deactivation, in the Rx operation mode configuration.
Figure 6:
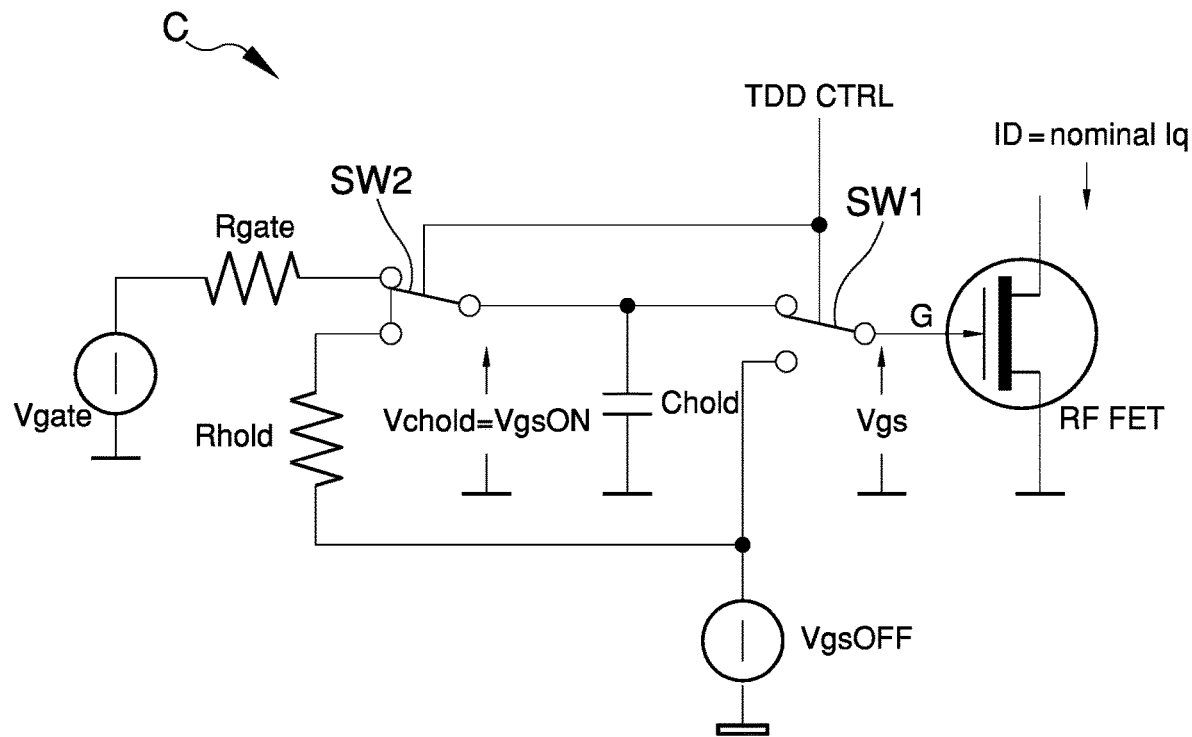
FIG. 6 is a high-level electrical scheme of the switch circuit for RF LDMOS activation/deactivation, in the Tx operational mode configuration.

The invention proposed realizes the circuit C to address the issue above, its high-level electrical representation is shown in FIG. 4 and FIG. 6 for Rx and Tx operating mode, respectively.

The circuit C comprises at least a field-effect transistor RF FET operatively connected to a power amplifier PA on the downlink path (DL) of a RF front-end apparatus in a TDD wireless communication system.

Furthermore, the circuit C comprises:
  a first voltage generator $Vgs_{OFF}$ connected to at least a large-value first resistor $R_{hold}$,
  a second voltage generator $V_{Gate}$ connected to a second resistor $R_{Gate}$;
  at least a large-value hold capacitor $C_{hold}$,
  a sample-and-hold circuit.

Particularly, the sample-and-hold circuit is configured to be switched between:
  a reception (Rx) configuration, wherein the first voltage generator $Vgs_{OFF}$ is connected to the gate G of the field-effect transistor RF FET and the large-value capacitor $C_{hold}$ is connected to the first voltage generator $Vgs_{OFF}$ through the first resistor $R_{hold}$, and
  a transmission (Tx) configuration, wherein the gate (G) of the field-effect transistor RF FET is connected to the hold capacitor $C_{hold}$ and the hold capacitor $C_{hold}$ is connected to the second voltage generator $V_{Gate}$ through the second resistor $R_{Gate}$.

According to preferred embodiment of the circuit C, the sample-and-hold circuit comprises a first electronic switch SW1 connected to the gate G of the field-effect transistor RF FET) and configured to be connected to the first voltage generator $Vgs_{OFF}$ in the reception configuration and to the hold capacitor $C_{hold}$ in the transmission configuration.

Furthermore, the sample-and-hold circuit comprises a second electronic switch SW2 connected to the hold capacitor $C_{hold}$ and configured to be connected to the first voltage generator $Vgs_{OFF}$ through the first resistor $R_{hold}$ in the reception configuration and to the second voltage generator $V_{Gate}$ through the second resistor $R_{Gate}$ in the transmission configuration.

Particularly, during the TDD RX phase (FIG. 4) the Gate G of the field-effect transistor RF FET is connected to the first voltage generator $Vgs_{OFF}$ through the first electronic switch SW1 driven by the TDD Synchronism Signal (TDD CRTL).

The first voltage generator VgsOFF is maintained to a constant value lower than the gate-source threshold voltage $Vgs_{th}$ of the field-effect transistor RF FET, which is defined as the voltage level corresponding to the field-effect transistor RF FET to be active (i.e. small amount of current flowing from Drain to Source).

In these conditions the field-effect transistor RF FET Drain current, $I_d$, is close to zero.

The second electrical switch SW2 connects the large-value capacitor $C_{hold}$ to the first voltage generator $Vgs_{OFF}$ through the large-value first resistor $R_{hold}$ (hold resistor).

The first resistor $R_{hold}$ allows controlling the discharge time of the hold capacitor $C_{hold}$ that results several orders of magnitude larger that TDD frame period. In this way, $V_{chold}=Vgs_{ON}$ is almost constant over entire RX phase when system is stable (i.e. out of transient initial phase), wherein $V_{chold}$ is voltage value over the hold capacitor $C_{hold}$.

Advantageously, the presence of the first (hold) resistor $R_{hold}$ assures that even when the system is not fed by any signal (no TDD CTRL to pilot the sample-and-hold circuit) the circuit C will reach idle conditions in a defined amount of time, i.e. when the hold capacitor $C_{hold}$ completes its discharge phase, and the system does not remain in the last active state (either Tx or Rx).

During TX phase (see FIG. 6) the Gate of the field-effect transistor RF FET is connected to the large-value hold capacitor $C_{hold}$ through the first electronic switch SW1 driven by TDD Synchronism Signal (TDD CRTL). The second electrical switch SW2 connects the hold capacitor $C_{hold}$ to the second voltage generator, $V_{Gate}$, through the second resistor, $R_{Gate}$, of the proper size.

Particularly, the second voltage generator $V_{Gate}$ and the second resistor $R_{Gate}$ are connected in series and behaves as an equivalent current generator, allowing the transistor RF FET quiescent current, $I_D$, to be kept constant over temperature.

To realize a proper dimensioning of the hold capacitor $C_{hold}$ and of the first hold resistor $R_{hold}$, the first condition to be met is that the variation of capacitor voltage value $V_{chold}$ overt time, defined as $V_{ripple}$, should be minimized. At the same time, the capacitor voltage value $V_{chold}$ should be as closer as possible to $V_{gs}$ stady-state value, $V_{gs\_SS}$, which is defined as the voltage upper limit reached when the system is working in Tx configuration for an infinite period of time.

Figure 5:
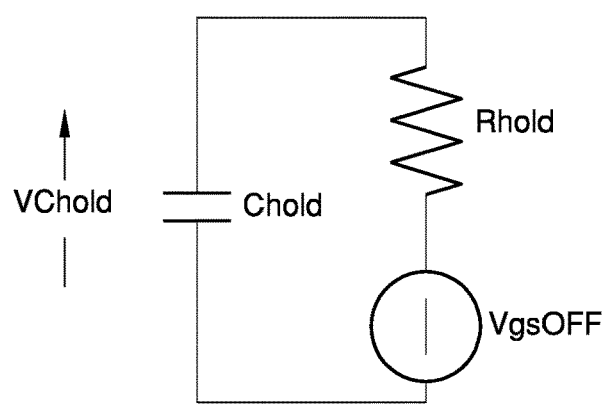
FIG. 5 shows an equivalent circuit in the Rx operational mode configuration.

The voltage variation $V_{ripple}$ is computed through the equation that describes the discharge phase of the hold capacitor $C_{hold}$ when in Rx operating configuration. In this case, the sample-and-hold circuit realizes a configuration equivalent to the one shown in FIG. 5, and the voltage variation $V_{ripple}$ is defined by:

$$V_{ripple}=(V_{chold}-V_{gsOFF})*e^{-tUL/(Rhold*Chold)}$$

where $t_{UL}$ is the maximum duration of the UL period in the 3GPP standard for TDD applications, i.e. worst-case condition, and $V_{chold}$ is the value taken at the beginning of the UL period.

Given $V_{chold}$ and $Vgs_{OFF}$, the aim is to minimize the voltage variation $V_{ripple}$ for an optimized choice of the hold capacitor $C_{hold}$ and of the hold resistor $R_{hold}$.

Preferably, the hold capacitor $C_{hold}$ should take a much-larger value (e.g. $10^5$ times more) than the transistor RF FET inherent input capacity, to disregard the parasite effects that may take place during the commutation phase. As described above, the voltage variation $V_{ripple}$ should also meet a second requirement, hence the hold capacitor $C_{hold}$ and the first resistor $R_{hold}$ should be optimized to minimize the equation below, describing the charge phase of the hold capacitor $C_{hold}$ during the transmission (Tx) configuration:

$$V_{ripple}=(V_{gs\_SS}-V_{chold})*(1-e^{-tDL/(Rgate*Chold)})$$

where $t_{DL}$ is the minimum duration of the DL period in the 3GPP standard for TDD applications, and $V_{chold}$ is the voltage value taken at the beginning of the DL period.

If $V_{chold}$ is close to $V_{gs\_SS}$, then the quiescent current actually drown by RF FET is very close to the nominal expected $I_q$.

Figure 7:
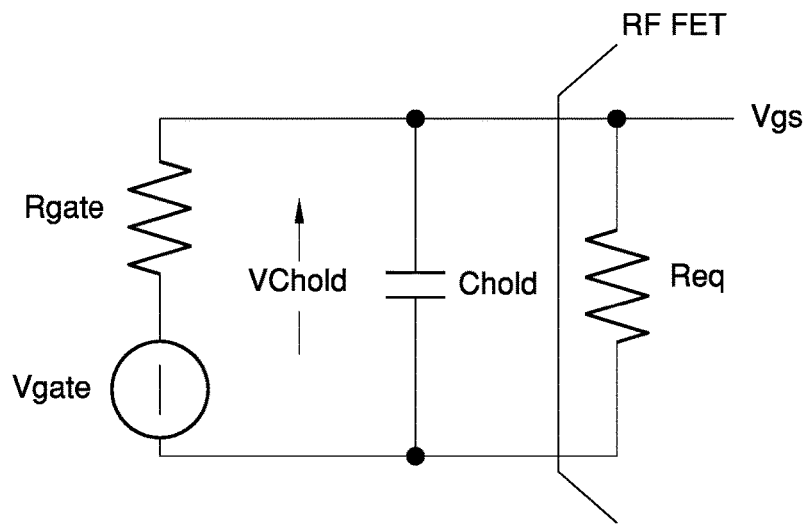
FIG. 7 shows an equivalent circuit in the Tx operational mode configuration.

In the transmission configuration, the sample-and-hold circuit realizes a configuration equivalent to the one shown in FIG. 7.

Considering the circuit C layout and functioning principle explained above, during the time intervals when the transistor RF FET is supposed to be ON (i.e. TX periods), the Gate measures a low dynamic impedance due to the large-value capacitor, $C_{hold}$, connected in parallel.

Similarly, during the time intervals when the transistor RF FET is supposed to be OFF (i.e. RX periods), the Gate still measures a low dynamic impedance, this time due to the connection to the first voltage generator, $V_{gsOFF}$.

In this way, transistor RF FET switching latency is short enough to comply with the limits defined by the standard, while assuring a precise thermal compensation over temperature of the quiescent current, $I_D$.

Moreover, achieving a short commutation latency between Tx/Rx phases minimizes the potential damaging impacts of reactive parasite effects of surrounding circuit components.

The TDD wireless communication system S according to the invention, showed in FIG. 3, comprises a downlink path DL PATH provided with at least a power amplifier PA, at least an uplink path UL PATH provided with at least a low-noise amplifier LNA, and at least an antenna ANT connected to the downlink path DL PATH and to the uplink path UL PATH.

The system S further comprises the circuit C for downlink/uplink operational mode switching as disclosed above, wherein the circuit C is operatively interposed between said power amplifier PA and said antenna ANT.

Furthermore, the system S comprises an RF switch placed in the uplink path UL PATH and connected to the circuit C, configured to be switched between the reception (Rx) configuration, wherein it is connected to said low-noise amplifier LNA, and the transmission (Tx) configuration, wherein it is disconnected from said low-noise amplifier LNA.

Particularly, in the transmission (Tx) configuration, the RF switch is connected to a resistor R.

With respect to the know system, the benefits introduced in the new system S by the new circuit C proposed allows then to remove the RF switch at the antenna port and place it in the UL path before LNA, as shown in FIG. 3.

Therefore, the circuit according to the invention allows to comply with stringent time requirements defined by the 3GPP standard for TDD operational mode switching latency.

The invention proposed realizes a solution a solution to control an LDMOS transistor equipped with an embedded thermal tracking device used in RF front end circuit to realize PA stages for TDD applications.

Particularly, the circuit according to the invention allows to reduce the overall cost of the used components. Requirements for RF switch isolation can be reduced thanks to the introduction of the invention proposed that allows transistor RF FET to be completely turned off.

Furthermore, the circuit according to the invention allows to reduce the loss in the DL path efficiency. Particularly, the introduction of the invention proposed avoids the introduction of an RF switch after the PA in the DL path, hence reducing DL I.L. and increasing overall system efficiency.

The circuit according to the invention further lets to improve the system reliability. The RF switch is placed on the UL path hence dealing with lower power levels and increasing system reliability.

Furthermore, the circuit according to the invention allows to reduce the power consumption. Particularly, the RF FET transistor is completely turned off in Rx phase, with quiescent current maintained almost zero.

The invention claimed is:

1. A circuit (C) for downlink/uplink operational mode switching in a TDD wireless communication system, comprising at least a field-effect transistor (RF FET) operatively connected to a power amplifier (PA) on the downlink path (DL) of a RF front-end apparatus in the TDD wireless communication system, the circuit comprising:
 a first voltage generator ($Vgs_{OFF}$) connected to at least a large-value first resistor ($R_{hold}$);
 a second voltage generator ($V_{Gate}$) connected to a second resistor ($R_{Gate}$);
 at least a large-value hold capacitor ($C_{hold}$);
 a sample-and-hold circuit configured to be switched between a reception (Rx) configuration, wherein said first voltage generator ($Vgs_{OFF}$) is connected to the gate (G) of said field-effect transistor (RF FET) and said large-value capacitor ($C_{hold}$) is connected to said first voltage generator ($Vgs_{OFF}$) through said first resistor ($R_{hold}$), and a transmission (Tx) configuration, and the gate (G) of said field-effect transistor (RF FET) is connected to said hold capacitor ($C_{hold}$) and said hold capacitor ($C_{hold}$) is connected to said second voltage generator ($V_{Gate}$) through said second resistor ($R_{Gate}$).

2. The circuit (C) according to claim 1, wherein
said sample-and-hold circuit comprises a first electronic switch (SW1) connected to the gate (G) of the field-effect transistor (RF FET) and configured to be connected to said first voltage generator (VgsOFF) in said reception configuration and to said hold capacitor ($C_{hold}$) in said transmission configuration.

3. The circuit (C) according to claim 2, wherein
said sample-and-hold circuit comprises a second electronic switch (SW2) connected to said hold capacitor ($C_{hold}$) and configured to be connected to said first voltage generator ($Vgs_{OFF}$) through said first resistor ($R_{hold}$) in said reception configuration and to said second voltage generator ($V_{Gate}$) through said second resistor ($R_{Gate}$) in said transmission configuration.

4. The circuit (C) according to claim 1, wherein
said first voltage generator ($Vgs_{OFF}$) is maintained to a constant value lower than a gate-source threshold voltage ($Vgs_{th}$) of said field-effect transistor (RF FET).

5. The circuit (C) according to claim 1, wherein
said hold capacitor ($C_{hold}$) and said first resistor ($R_{hold}$) are dimensioned by minimizing the variation ($V_{ripple}$) of capacitor voltage value ($V_{chold}$) overt time.

6. The circuit (C) according to claim 1, wherein
said hold capacitor ($C_{hold}$) and said first resistor ($R_{hold}$) are dimensioned by maintaining the hold capacitor ($C_{hold}$) voltage value ($V_{chold}$) as closer as possible to gate-source voltage steady-state value ($Vg_{s\_ss}$), which is defined as the voltage upper limit reached when the system is working in Tx configuration for an infinite period of time.

7. The circuit (C) according to claim 1, wherein
said hold capacitor ($C_{hold}$) and said first resistor ($R_{hold}$) are dimensioned by minimizing the following equation, that describes the discharge phase of said hold capacitor ($C_{hold}$) in said reception (Rx) configuration:

$$V_{ripple}=(V_{chold}-V_{gsOFF})*e^{-tUL/(Rhold*Chold)}$$

wherein:
$V_{ripple}$ is the variation of said hold capacitor ($C_{hold}$) voltage value ($V_{chold}$);
$V_{chold}$ is the hold capacitor ($C_{hold}$) voltage value;
$Vgs_{OFF}$ is the voltage value of said first voltage generator;
$t_{UL}$ is the maximum duration of the UL period;
$R_{hold}$ is the value of said first hold resistor; and
$C_{hold}$ is the value of said hold capacitor.

8. The circuit according to claim 1, wherein
said hold capacitor ($C_{hold}$) and said first resistor ($R_{hold}$) are dimensioned by minimizing the following equation, describing the charge phase of said hold capacitor ($C_{holdh}$) during said transmission configuration:

$$V_{ripple}=(V_{gs\_SS}-V_{chold})*(1-e^{-tDL/(Rgate*Chold)})$$

wherein:
$V_{ripple}$ is the variation of said hold capacitor ($C_{hold}$) voltage value ($V_{chold}$);
$V_{gs\_SS}$ is the to $V_{gs}$ steady-state value, which is defined as the voltage upper limit reached when the system is working in transmission configuration for an infinite period of time;
$V_{chold}$ is the hold capacitor ($C_{hold}$) voltage value, taken at the beginning of the downlink period;
$t_{DL}$ is the minimum duration of the downlink period;
$R_{hold}$ is the value of said first hold resistor; and
$C_{hold}$ is the value of said hold capacitor.

9. A TDD wireless communication system (S), comprising at least downlink path (DL PATH) provided with at least a power amplifier (PA), at least an uplink path (UL PATH) provided with at least a low-noise amplifier (LNA), and at least an antenna (ANT) connected to said downlink path (DL PATH) and to said uplink path (UL PATH), wherein the TDD wireless communication system comprising:
the circuit (C) for downlink/uplink operational mode switching according to claim 1, wherein said circuit (C) is operatively interposed between said power amplifier (PA) and said antenna (ANT), and
at least an RF switch (RF SWITCH) placed in said uplink path (UL PATH) and connected to said circuit (C), wherein said RF switch is configured to be switched between
said reception (Rx) configuration, wherein said at least an RF switch (RF SWITCH) is connected to said low-noise amplifier (LNA), and
a transmission (Tx) configuration, wherein said at least an RF switch (RF SWITCH) is disconnected from said low-noise amplifier (LNA).

10. The circuit (C) according to claim 7, wherein
$t_{UL}$ is the maximum duration of the UL period in the 3GPP standard for TDD applications.

11. The circuit according to claim 8, wherein
$t_{DL}$ is the minimum duration of the downlink period in the 3GPP standard for TDD applications.

* * * * *